United States Patent [19]

Nord

[11] 4,134,149
[45] Jan. 9, 1979

[54] HIGH SWEEP RATE WAVEFORM DISPLAY CONTROL FOR DIGITAL RECORDING WAVEFORM DEVICES

[75] Inventor: Russell H. Nord, Fort Atkinson, Wis.

[73] Assignee: Norland Corporation, Fort Atkinson, Wis.

[21] Appl. No.: 670,889

[22] Filed: Mar. 26, 1976

[51] Int. Cl.² ........................... G06F 3/14; G06F 3/05
[52] U.S. Cl. .................................... 364/900; 340/711; 340/731; 340/750; 340/799
[58] Field of Search ........ 340/172.5, 324 A, 324 AD; 315/365; 364/200 MS File, 900 MS File, 521

[56] References Cited

U.S. PATENT DOCUMENTS

| | | | |
|---|---|---|---|
| 3,585,440 | 6/1971 | Lee | 340/324 A X |
| 3,634,828 | 1/1972 | Myers | 340/172.5 |
| 3,786,476 | 1/1974 | Graves | 340/324 A |
| 3,793,626 | 2/1974 | Zambuto | 340/324 A |
| 3,909,792 | 9/1975 | Harris | 364/900 |

Primary Examiner—James D. Thomas
Attorney, Agent, or Firm—Andrus, Sceales, Starke & Sawall

[57] ABSTRACT

A digital waveform measuring and display oscilloscope includes a digital memory which stores one full screen of waveform data. The analog waveform is sampled, digitized and placed in memory at a user selected mode and sampling rate. A data acquisition mode control permits the user to select a continuous mode in which a live waveform is displayed moving from the right to the left on the screen. A hold mode is provided in which a preceding full screen data array is captured in the memory and displayed as a static display. A trigger mode is also provided with a variable delay, related to multiples of a full screen array, in which one full screen array is captured in relation to a trigger event and displayed as a static display. A particularly unique Periodic Hold mode creates a cyclical sequence which includes data acquisition and simultaneous display blanking which is terminated in response to a trigger signal sequence. The captured data is displayed for a short time and is followed by an automatic signal to the control system to again initiate acquisition of the waveform signal in a free running mode. As data is acquired, the trigger circuit is automatically enabled to again stop the data acquisition at or following a trigger signal. The display is blanked during each data acquisition with the previous image momentarily retained on the display screen during the blanking period. The display is a series of static displays which appear to the user essentially in the form obtained with a conventional oscilloscope.

7 Claims, 9 Drawing Figures

HIGH SWEEP RATE WAVEFORM DISPLAY CONTROL FOR DIGITAL RECORDING WAVEFORM DEVICES

BACKGROUND OF THE INVENTION

This invention relates to a digital oscilloscope apparatus having means for visually displaying electrical waveforms.

Oscilloscopes of a conventional analog type and more recently of a digital type are widely employed in the measurement and analysis of changing physical phenomena. Generally, a transducer develops an analog voltage signal in accordance with a sensed physical phenomena. The transduced electrical signal is connected as the input to the oscilloscope which includes beam control means for providing a visual display or representation of such signal as a waveform. The changes being measured and analyzed may be either continuous and periodic or transient. In modern oscilloscopes, a trigger circuit is included so that the portion of the transduced signal displayed is that portion which occurs at a specific selectable time following a trigger event. In a conventional analog oscilloscope, a CRT tube includes a scanning beam which sweeps across a screen to generate the display. In the analog oscilloscope the CRT sweep starts when the trigger signal arrives. Thus, the portion of the waveform displayed is that immediately following the trigger signal and continuing for one horizontal full scale sweep time. In the case of a transient (one time only) signal, the conventional oscilloscope operates in a single sweep mode wherein the instrument is triggered once and sweeps once to present the signal. In the case of a continuous and periodic signal, the conventional oscilloscope is run in a mode whereby as soon as the CRT sweep resulting from one trigger signal is completed, the instrument automatically enables its trigger circuit to accept another trigger signal and repeat the process. Since the signal is periodic, if the trigger signal is derived from a point on the waveform itself the effect is that each sweep of the CRT display is written over the previous one and the displayed waveform representation appears stationary. If the input periodic waveform is, however, not perfectly periodic in that each succeeding period differs slightly from the last, then the display, which is a succession of individually displayed periods of the signal, varies from sweep to sweep, showing the changing character of the waveform much as a motion picture projector shows individual frames, which differ slightly, in rapid succession to give the overall impression of a varying or moving picture.

The above mentioned trigger event may be a special signal pulse whose main purpose is to trigger the oscilloscope but more often it is a part of the input signal waveform which has certain requisite characteristics. The oscilloscope is provided with user operated controls for selection of the source and the particular characteristic for generation of the trigger event. The particular characteristic may be a voltage level, a voltage rate of change, a voltage direction of change or the like. The characteristic which is to form the trigger event is specified by the user by adjustment of the controls which are usually set by changing the control settings while watching the resulting changes on the displayed waveform. Thus, the usual method of adjusting oscilloscope trigger controls requires that the displayed waveform immediately reflect the effect of the adjustment to the user.

The conventional oscilloscope, in its several modes, directly processes and displays the input signal upon the screen for a momentary finite time, after which the signal is lost. If any of the data or information is to be retained for extended viewing, photographic means must be provided, the signal stored in some other medium or a special type of CRT possessing a mechanism for storage of images must be employed.

The more recent digital type oscilloscopes employ a finite digital memory in which the waveform input signal is stored and from which the display is generated. The digital oscilloscope thus performs the function of displaying a representation of the input waveform by digitizing the input signal, storing such digitized signal in memory and reproducing a visual representation of the analog signal from such digitized data. Various modes of signal acquisition and presentation are provided in recently developed digital oscilloscopes. The waveform can be presented as a continuous live display in which the input waveform appears to flow across the display screen, being created at the right-hand edge of the screen as it occurs, or the flow may be halted and one full memory array thus captured for a static display. Display and analysis of a periodic continuous waveform with the digital oscilloscope usually is accomplished by providing sequence sweep signals allowing the instrument to take one full memory sample of the waveform which is displayed and then a new full sample taken and again displayed.

Recent developments of data taking in a digital instrument known as a transient recorder provide for a triggered mode of capturing the desired portion of the changing signal by selection of its time relationship with the trigger signal. In such a mode the data acquisition is coupled to the memory means until the triggering event occurs, and then such coupling is continued until a specified delay time expires, after which the data acquisition is halted by decoupling from the memory means. The waveform in the memory is then the waveform as existing at the time specified with relation to the trigger event.

The triggered mode of operation was initially developed for measuring and recording transient phenomena which permit the user to capture and analyze a transient waveform. Hence the devices are generally known as transient recorders. The transient recorder may be coupled to a suitable oscilloscope to display the captured transient signals in much the same way as the conventional oscilloscope. That is, a trigger signal produces a single data memory array containing a single portion of the input waveform.

A particularly unique waveform measuring and analyzing instrument incorporating all of the characteristics of digital oscilloscopes and transient recorders and, in addition, programmed signal processing capability is disclosed in the copending application of Frederick A. Rose entitled "WAVEFORM MEASURING MEANS WITH RESIDENT PROGRAMMED PROCESSOR FOR CONTROLLED WAVEFORM DISPLAY AND WAVEFORM DATA REDUCTION AND CALCULATION", filed Ser. No. 670,703 on the same day as this application and assigned to the same assignee, now U.S. Pat. No. 4,072,851. As more fully disclosed therein, the instrument is allowed to free run, that is, to continuously take samples of the waveform and shift them through memory in the manner of a transient recorder. This free running mode produces the effect of the live waveform moving from the right edge to the left edge on the display screen. For slow sampling rates, useful for slowly varying signals, the waveform marches slowly across the screen and variances in successive periods can easily be perceived. For faster varying signals the sample rate, and, hence the rate of marching, must be increased and eventually a point is reached where the eye cannot follow or discern detail in the individual periods of the waveform, and the display becomes a rather useless blur. The addition of a trigger circuit in the instrument permits the operator to capture a single period or portion of the waveform, without the need to discern detail on the display. However, the display of the one sample portion, once captured, is completely static and does not show slow variations similar to a motion picture effect, as does the conventional oscilloscope.

SUMMARY OF THE PRESENT INVENTION

The inventor's analysis of the oscilloscope and various digital instruments and the mode of presentation has resulted in the discovery and the realization that periodic signals may be sampled at a high rate in a digital instrument and the information may be uniquely captured and displayed as a series of closely-spaced captured waveform portions, each of which is held statically on the display means for a short time before the sampling for the next portion is begun. The waveform presentation then appears as an essentially stationary waveform, with the variations from one period to another readily discernible. The display is, therefore, in appearance very similar to the standard triggered display of a conventional analog oscilloscope.

Generally, in accordance with the present invention, a digital oscilloscope unit operates in a unique periodic hold mode. Means are provided to initiate the waveform data acquisition and storage, with automatic termination in response to a trigger signal. The captured data is displayed on a display device for a fixed length of time or for a length of time dependent on the sample rate, or a combination of these, and is followed by an automatic signal to the digital oscilloscope to again initiate acquisition of the waveform signal in a free running mode. Immediately upon resumption of data taking, a trigger circuit is automatically enabled to again stop the data acquisition at or following a trigger signal. During such data acquisition period, the display is operatively blanked in any suitable manner such as by decoupling memory means from the oscilloscope display device. At high sample rates, a previous image is readily retained on the phosphor screen of the conventional display device during the blanking period. The inventor has found that this permits sampling a rapidly changing waveform at a very high sample rate, up to the order of one sample per microsecond. The presentation to the user is a series of time-spaced triggered waveforms but at such a rate as to appear as a continuously presented waveform for appropriate and accurate visual viewing and recognition where changing waveforms are being analyzed. Thus, the display as presented is essentially that obtained with a conventional oscilloscope.

More particularly, in a preferred embodiment of the present invention employing a digital oscilloscope with a triggered operating mode, a control logic means is connected to effectively actuate a TRIGGERED HOLD mode of data acquisition each time the machine enters the data display state and remains in that state for a period of time equal to the time required to acquire at least one full memory of data samples at the selected sample rate, with automatic display blanking during the period the data is being placed in memory. The operator sets the instrument to create a trigger delay of one full scale after the trigger event to allow at least one full memory of new data to be collected before halting data acquisition, at which time the display means is operatively coupled to the memory means; then replacing the previously displayed waveform on the display unit with a single new waveform which is again displayed a suitable period. A restart signal is then generated which again activates the data acquisition means to again sample and digitize the incoming signal for storage in the memory means. Simultaneously, the transmission of the stored signal to the CRT display is again blanked so as to prevent disruptive presentation of the displayed waveform. The logic means responds to a new trigger event or signal to halt the data acquisition means and store the last waveform array and thereby initiate a new cycle identical to that just presented.

The digital waveform measuring instrument of the present invention continuously displays a series of unique, closely spaced waveform arrays on the display screen which is similar in appearance to the presentation of a conventional, continuous waveform presentation analog oscilloscope. This invention thus develops a display of a rapidly sampled and digitized periodic waveform in a clear, uncluttered presentation.

BRIEF DESCRIPTION OF THE DRAWINGS

The drawings furnished herewith illustrate the best mode contemplated for carrying out the invention and in which the above advantages and features are clearly disclosed as well as others which will be readily understood from the following description of such embodiment.

In the drawings.

DESCRIPTION OF ILLUSTRATED EMBODIMENT

Figure 1:
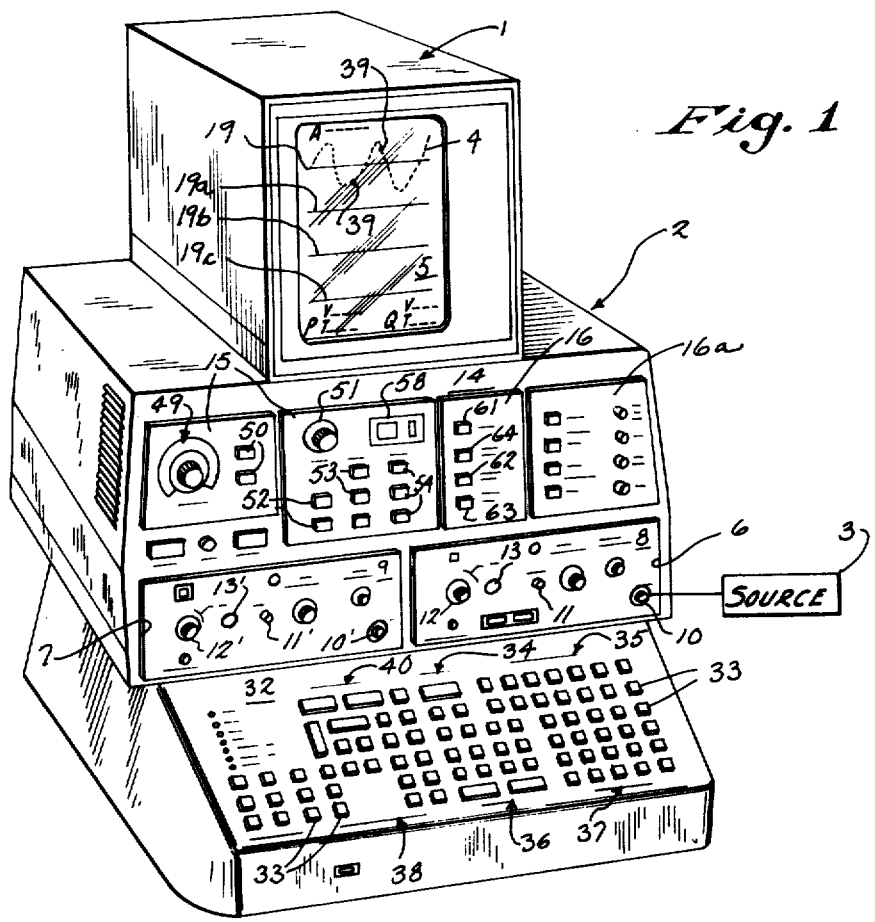
FIG. 1 is a pictorial view of an instrument constructed in accordance with the present invention.

Referring to the drawings and particularly to FIG. 1, a pictorial view of a waveform display and analyzing instrument is shown including a visual display unit 1 which is preferably a conventional high speed monitoring CRT oscilloscope. The unit 1 is connected to form an integrated element of a programmable processor unit 2 which is adapted to be connected to a waveform source 3 and drive the CRT unit 1 to display related waveforms 4 on the CRT screen 5 as disclosed in the previously identified copending application. The unit 2 generally includes a pair of waveform data acquisition receptacles 6 and 7 for receiving data acquisition plug-in units 8 and 9 permitting the user to tailor the instrument to the user's present and future needs. The plug-in units 8 and 9 include a signal input jack 10 and various controls such as an offset control 11, memory selection control 12, a gain control 13 and the like. The unit 2 is conveniently constructed with an upper housing portion having a front control panel 14 including the receptacle openings in the lower portion and a data acquisition time base control section 15, a data acquisition mode section 16 and a display location section 16a in the upper portion.

Figure 3:
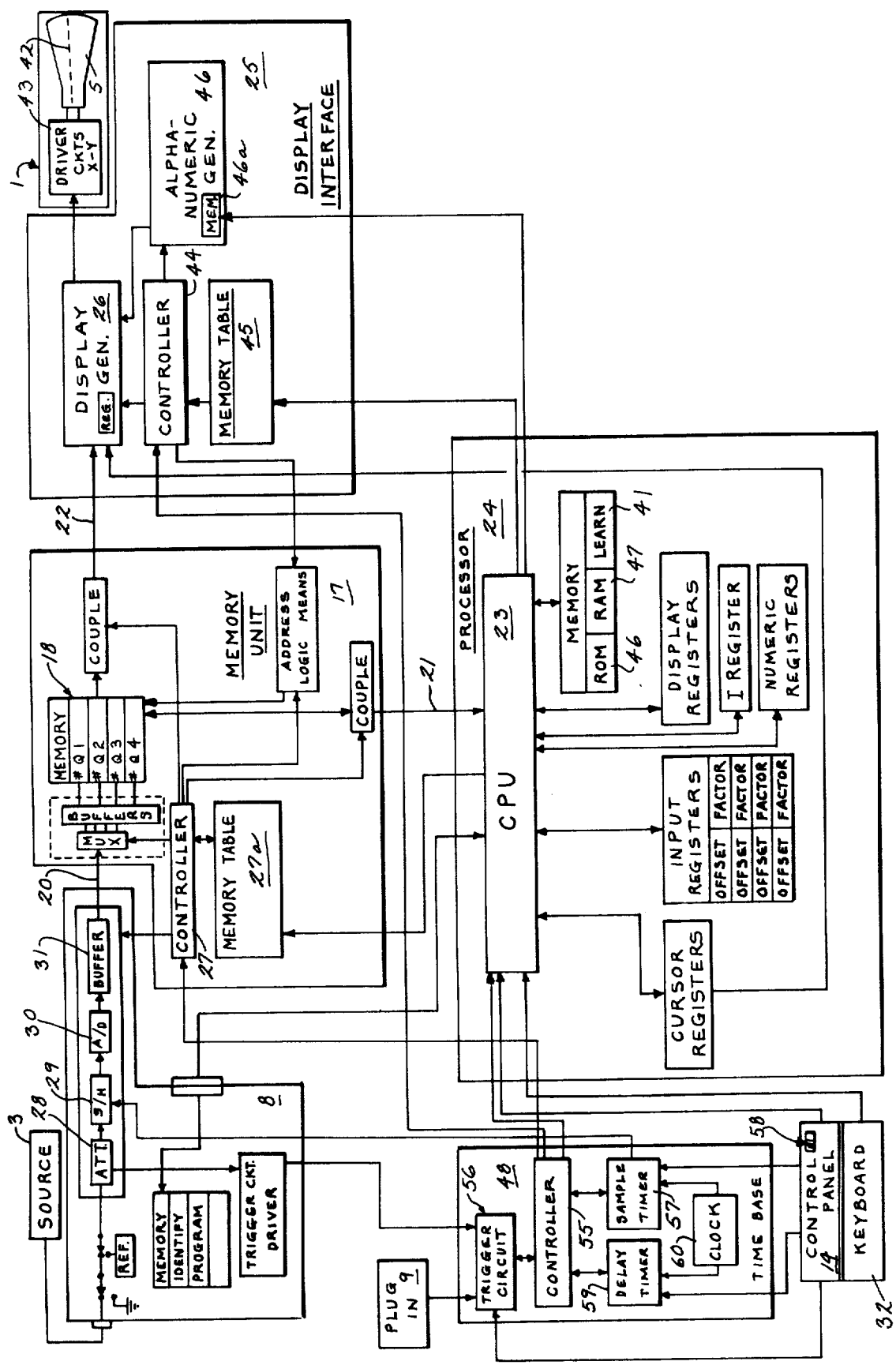
FIG. 3 is a schematic block diagram of the instrument.

Generally, data is digitized into a series of digital equivalents which are stored in a digital memory unit 17, shown in FIG. 3. The digitized signals in memory are converted to analog signals for display on screen 5. As shown in FIG. 3, the digital memory unit 17 includes a memory bank 18 which may include four equal memory array parts with appropriate individual ports for storing up to four different waveforms, one in each array. The several individual arrays are identified by symbols $Q_1$, $Q_2$, $Q_3$ and $Q_4$. The waveforms may be simultaneously displayed on the CRT screen in four vertically spaced quadrants as shown at 19, 19a, 19b and 19c in FIG. 1.

The memory unit 17 and particularly memory bank 18 includes three ports 20, 21 and 22 which are hard-wired to receive and transmit data. Port 20 is a write-only port connected to the plug-in units 8 and 9 for writing waveform data in memory locations. Port 21 is a read-write port connected to a central processing unit (CPU) 23 of a programmed processor 24 for communicating with the processor and permitting reduction and calculation of the waveform data. The port 22 is a read-only port connected to a display interfacing unit 25 for transmitting the data in memory to drive the display unit 1 and particularly to a display generator 26.

The illustrated memory unit 17 includes a sequence controller 27 which has a memory table 27a connected to and written by the CPU 23 to control the data acquisition routing into memory bank 18. For example, as more fully described in the copending application entitled "RANDOM ACCESS MEMORY APPARATUS FOR A WAVEFORM MEASURING APPARATUS", of Steven R. Smith and Frederick A. Rose, Ser. No. 670,890 which was filed on the same day as this application and is assigned to the same assignee, now U.S. Pat. No. 4,093,995. Generally, the memory controller 27 maintains a record of the memory initial or zero time slot in relationship to the real addresses of the memory bank. The sampled data is placed in memory bank 18 in the first time slot following that last filled with data such that the time zero slot varies with each sample. The controller 27 insures that whenever a particular data location is requested, the proper data sample is readout. A hardwired controller 27 provides a simple and reliable sequencing of the memory unit.

As shown in FIG. 3, the input waveform signal is impressed on a signal sampling and digitizing interface circuit resident in the plug-in unit. The circuit includes an attenuator 28, a sample and hold circuit 29, an analog to digital converter 30 and a buffer register 31. The waveform sample is digitized and placed in the memory bank 18. The portion of the memory array in which the waveform sample is placed is selected by a user operated selection control 12 on the plug-in unit 8 or 9 for selective display on CRT screen 5.

Figure 2:
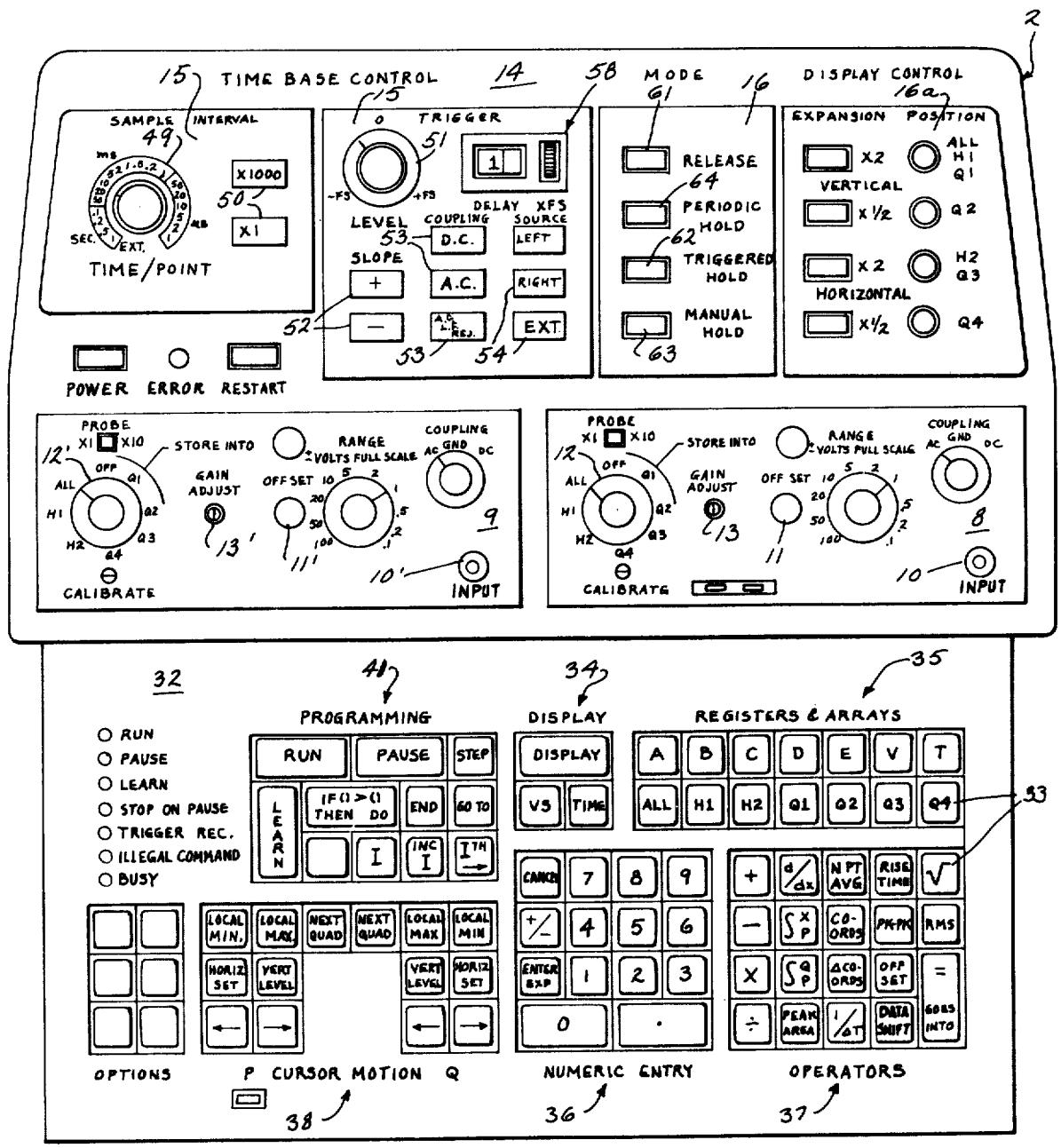
FIG. 2 is a front elevational view of the instrument shown in FIG. 1.

A forwardly extending lower keyboard panel 32 includes a plurality of interactive pre-programmed keys 33, as more fully shown in FIG. 2, for user operated control. The keyboard 32 provides user selection of the waveform display format and direct user controlled resident data reduction with respect to the waveform data. The calculated results of such data reduction may be visually displayed as on CRT screen 5.

The user operated keyboard keys of keyboard 32 and the data acquisition and display controls 15-16 of panel 14 are connected to the processor 24, shown in FIG. 3, for programmed execution of the acquisition and display and of selective data reduction and calculation functions on the waveform data.

The lower keyboard panel 32 generally includes a display format key group or section 34 to initiate the display of data and a register-array section 35 for selection of the data to be displayed from the memory bank 18 and related storage registers for storing of processor calculated values and the like. A numeric entry key group or section 36 provides for introduction of conventional decimal numbers into calculation and data reduction, particularly in connection with a command or an operator section 37 for directly commanding execution of selected calculations and reduction of data. The calculation keys of section 37 are provided with indicia which particularly identify the keys by known symbols for the functions employed in waveform analysis and reduction. Cursor motion control section 38 selectively and uniquely controls the position of a pair of cursors 39 on screen 5. A "learn" control section 40 for user insertion of a sequence of keystroke inputs into the learn memory 41 is also shown.

The unique interactive keyboard and panel, as more fully disclosed in the previously identified applications, establishes a highly flexible decision-making instrument which is conveniently and readily controlled and operated by technical personnel without requiring special knowledge of technical processing machine language, particularly with the keys producing direct data calculation and reduction of waveform and related data.

The display unit 1 is preferably the known high speed CRT monitoring tube which includes a beam 42 which is directly located and brightened by a driver circuit 43. The driver circuit 43 is connected to the output of the display generator 26 of the interface unit 25 in accordance with the x-y coordinates in the memory. The memory bank 18 includes a separate address or location for each display point and each full memory array provides a complete screen width of data.

The display interfacing unit 25 includes a sequence controller 44 with a memory table 45 written by the processor 24 for controlling the waveform display format. An alphanumeric generator 46 is provided for generating display of alphanumeric information on the CRT screen 5 in accordance with instruction from the processor written in a memory 46a. Table 45 and memory 46a are written by the processor 24 to control the waveform and alphanumeric information presented in accordance with the user operation of the interactive panels.

The processor 24 generally includes the CPU 23 connected to read the front control panel 14, the keyboard panel 32 and the plug-in receptacles 6 and 7. The processor 24 further includes a memory bank having a program memory 46 which may be a read-only memory including the basic program for the CPU and various software programs for the several user operated inputs of panels 14 and 32. The CPU 23 also communicates with a scratch pad memory 47 of the processor memory bank for manipulation and calculation of data as well as with other memory provided in the instrument in relation to waveform data placed in memory unit 17. A time base control circuit or unit 48 is connected to the processor 24 and forms a logic control means for placing the memory unit 17 and the display unit 25 in the active and inactive states. The processor 24 reads the user operated controls which are provided for selection of various modes of data acquisition and commands the time base unit 48 to produce appropriate signals to the memory unit 17 and the display interface unit 25 for the display unit 1. The sampling mode is user controlled by setting of the controls in sections 15 and 16 of the panel 14.

In FIGS. 1 and 2, time base control section 15 of the instrument includes means for setting the sample rate and a trigger means for various modes of data acquisition which may be selected from the mode control section 16. Section 15 includes a sample interval selection knob 49, with multiplier input buttons 50 to increase the available rates or frequency at which data is sampled; for example, from 1 microsecond per sample to 1000 seconds per sample. Trigger controls are provided for sampling in relation to a selected trigger signal as more fully developed hereinafter. The trigger controls include a rotary level control element 51, a pair of slope control push buttons 52, A.C.-D.C. coupling control push buttons 53 and trigger source selection control buttons 54 for selecting an external source or the right or left plug-in unit 8 or 9. As shown in FIG. 3, time base unit 48 generally includes controller 55 for communicating with the system components. A trigger circuit 56 has an input to the controls of section 15. The trigger circuit 56 is also connected by a driver circuit 56a to the attenuator 28 of plug-in units 8 and 9, and thus the trigger event may be derived from the waveform or from any external source. The controller 55 is connected to a sample timer circuit or unit 57 of the time base unit 48 which is also connected to the control section 15. The time base controller 55 is connected to the memory unit controller 27 to establish the proper activation of the data memory unit 17 for sampling the data and also storing each sample in the data memory 18.

A delay switch means 58 on panel 14 allows the user to select a waveform starting up to one full scale or screen of memory before the trigger signal or up to 8⅛ full scales after the trigger signal. The time base unit 48 includes a delay timer means 59 which is driven from the same clock 60 which drives the sample timer 57. The delay timer means 59 is connected to and set by the delay switch means 58 to develop a delayed trigger signal. The delay timer is suitably incorporated into the overall control system by the time base controller 55 to create the desired portion of the waveform with respect to the trigger event.

The mode of sampling of the waveform data is further controlled by user operated controls in the mode section 16. The user operated controls include a release mode button 61, a triggered hold button 62 and a manual hold button 63 which provide modes of data acquisition generally similar to modes in transient recorders. Thus, release button 61 provides for continuous sampling the waveform signal and the simultaneous display of a live waveform 4, moving across screen 5. Manual hold button 63 provides for the stopping, taking of data samples and holding the immediately preceding sampled waveform in memory for analysis. If the manual hold button 63 is sequentially actuated, one full scale of data samples is taken and stored in memory for each actuation, and which is generally referred to herein as a New Full Array mode. The triggered hold button 62 provides continuous data sampling until receiving a trigger signal, as set by the trigger controls 54. A full screen width of data occurring relative to the trigger event is selected by setting the delay switch means 58.

The present invention is particularly directed to a unique mode of data acquisition and display. In the illustrated embodiment, a unique Periodic Hold mode button 64 in section 16 provides for an automatic sequence in which successive waveform sample are taken at a high rate and each waveform sample is held statically on the screen before the next sample is taken and during the taking of such next sample such that a continuous waveform appearing to be at standstill appears on the screen.

The operation of any mode button 61–64 is read by the processor 24 and an appropriate routine executed to sequence the data acquisition system identified by the plug-in unit 8, the display system identified by the interface unit 25 and the timing control system 48 to create the desired modes of sampling and display. The several systems are identified by the numbers related to the basic components shown, for simplicity of explanation. The several systems also include the related necessary elements of the memory unit, the CRT tube and the like.

The instrument is only described herein as required to fully explain the apparatus to implement the several modes provided in the illustrated embodiment of the present invention. For a fuller description of the other aspects and features of the illustrated embodiment of the instrument, reference may be made to the previously identified copending applications. More particularly, the input mode of the illustrated embodiment is generally related to the operative condition or state of the data acquisition system, of the display system and finally of the timing control system of the instrument.

In order to perform a selected data acquisition mode in response to actuation of one of the four mode buttons 61–64, the instrument must control the individual function of these systems. In particular, the data acquisition system 8 is set to be either active or inactive. In the active state, the system samples the input signal and sequentially stores the results in the data memory 18. In the inactive state, the data acquisition system does nothing. Similarly, the display system 25 is set to be either active or inactive. In the active state, the display system 25 reads and displays the waveform in the data memory. This is referred to as the unblanked state. In the inactive state, the display system does nothing. This is referred to as the blanked state. Finally, the control system 48 is set to be responsive to only a certain set of signals generated within the instrument as a result of the actuation of one of the mode buttons 61–64, with each set being unique to the selected input mode. This is referred to as a state of the control system.

Figure 4:
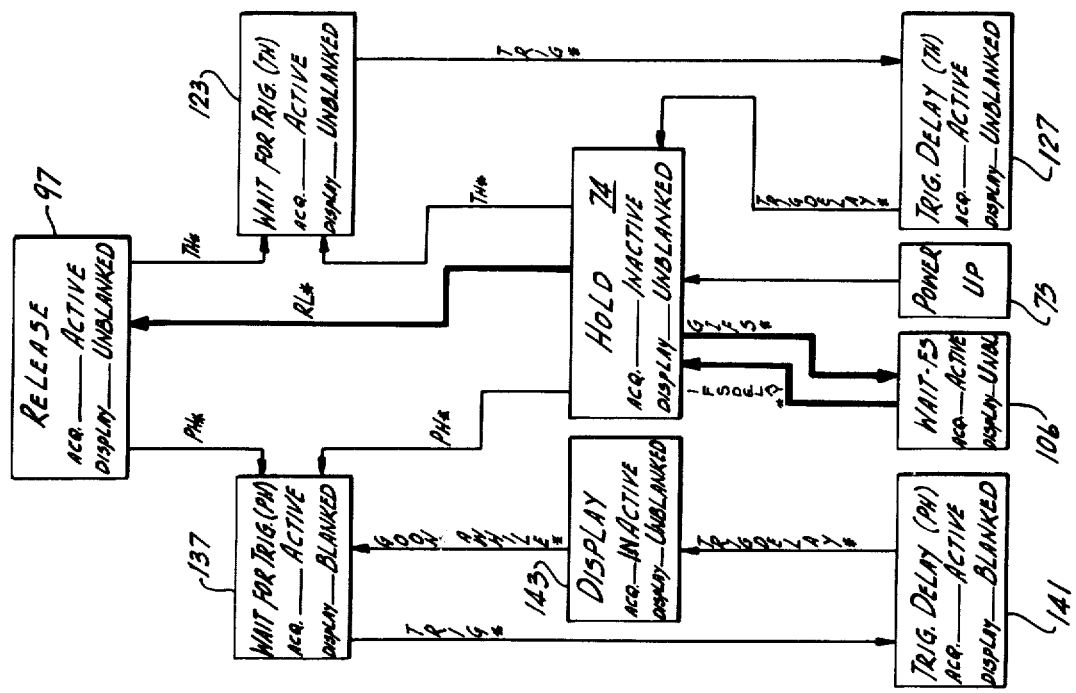
FIG. 4 is a state diagram illustrating the possible states of the instrument and the transitions between such states.
Figure 5:
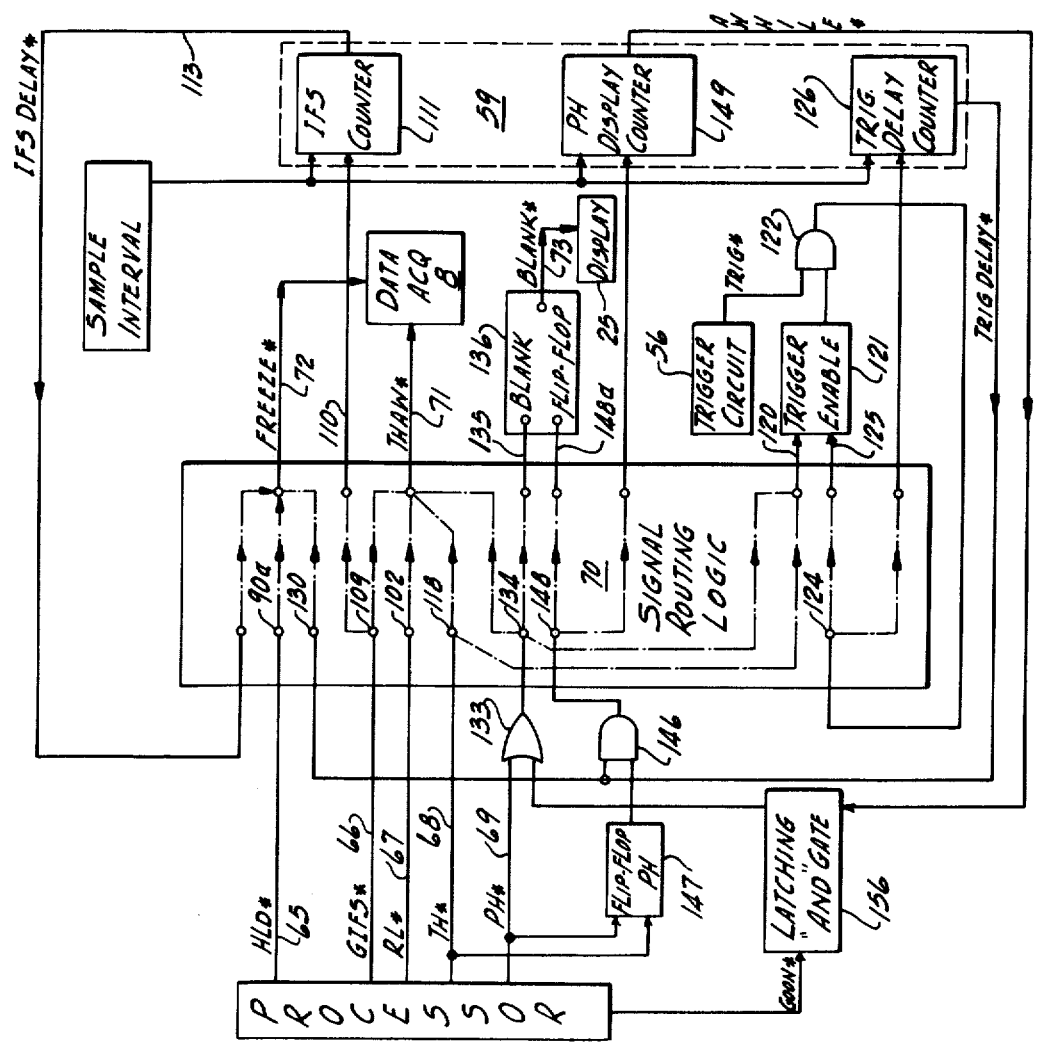
FIG. 5 is a simplified block diagram of the signal routing system for control signals which establish the various operating modes.
Figure 8:
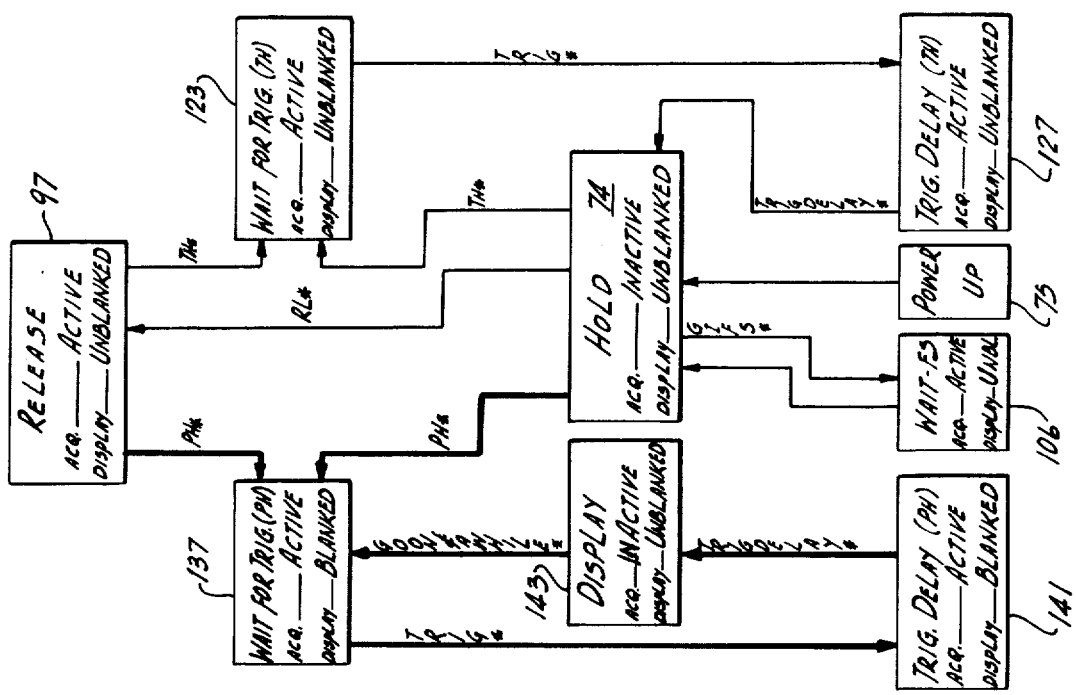
FIG. 8 is a diagram similar to FIG. 4 illustrating a Periodic Hold mode of data acquisition.
Figure 7:
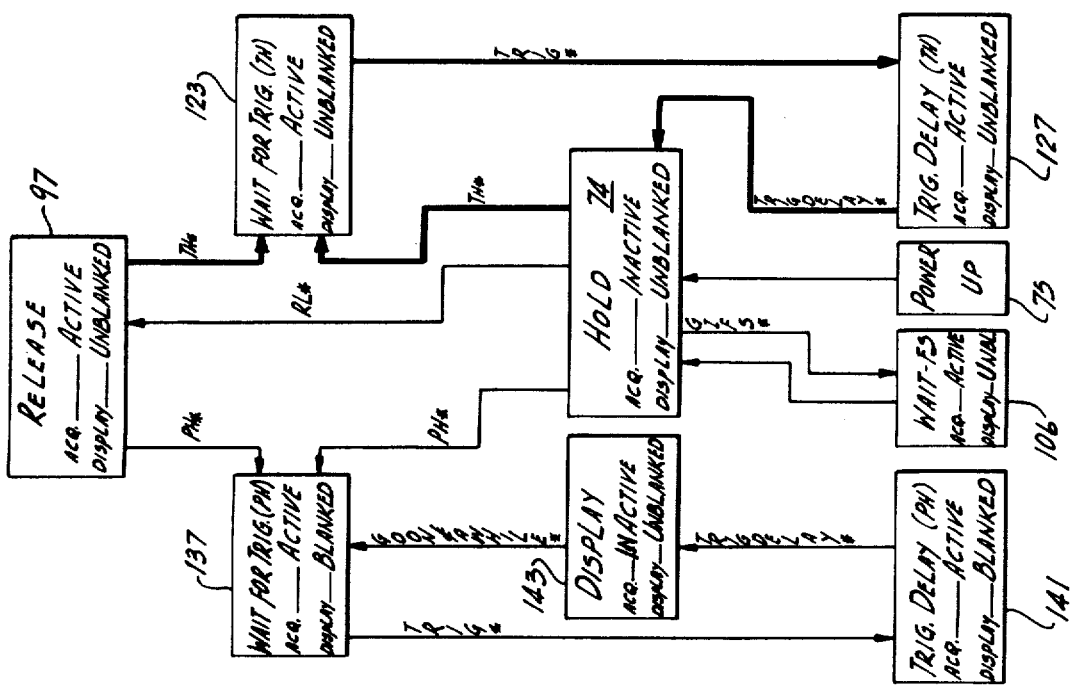
FIG. 7 is a diagram similar to FIG. 4 illustrating a Triggered Hold mode of data acquisition.

Any combination of the above mentioned system states comprises a state of the instrument. FIG. 4 is a state diagram which illustrates nine permitted states of the instrument, which, in various combinations, produce the several modes of buttons 61–64. Each instrument state is represented by a box which is identified by the name of the state for descriptive purposes. Also shown in each box are the system states of the data acquisition system 8 and of the display system 25 for the particular instrument state. The control system state is illustrated by arrows linking the instrument state boxes, with the operative control signal identified by an abbreviation associated with the arrows and more fully described hereinafter. The darkened lines in FIG. 4 and in FIGS. 7 and 8 illustrate particular modes. Thus, FIG. 4 not only defines the nine states of the instrument, but also shows the principal transitions among them. The pattern of transition among the states of the instrument show the way in which the data acquisition modes are implemented in the instrument. FIG. 5 is a simplified illustration of a signal routing circuit for producing the states of FIG. 4 in response to a mode button input. The processor 24 develops the appropriate mode signal in response to a button actuation 61-64 at one of five mode signal lines identified respectively as the Hold signal line 65 (HLD*), a Get One Full Scale signal line 66 (GIFS*), a Release signal line 67 (RL*), a Triggered Hold signal line 68 (TH*) and a Periodic Hold signal line 69 (PH*). The lines are identified by illustrated signal abbreviations, with the associated star or asterisk employed as identifying a signal. This signal abbreviation convention is also employed in FIG. 4, except that in FIG. 4 the signal abbreviations serve to identify transitions rather than signal lines. In FIG. 5 the signals are routed via a suitable signal routing logic means 70 to generate appropriate signals at component control lines, including start and stop lines 71 and 72 to data acquisition system 8 and a blank line 73 to the display system 25. For placing the data acquisition and display systems in the appropriate active or inactive states, the lines 71 and 72 have associated "THAW*" and "FREEZE*" signals and line 73 a "BLANK*" signal, as shown. The logic routing system 70 introduces certain time sequences into the creation of data acquisition mode. The signal routing logic means may employ conventional logic circuitry and components and the signal paths are thus shown by phantom lines between the various input-output terminals. The necessary and suitable logic components can be readily provided by those skilled in the art.

Figure 6:
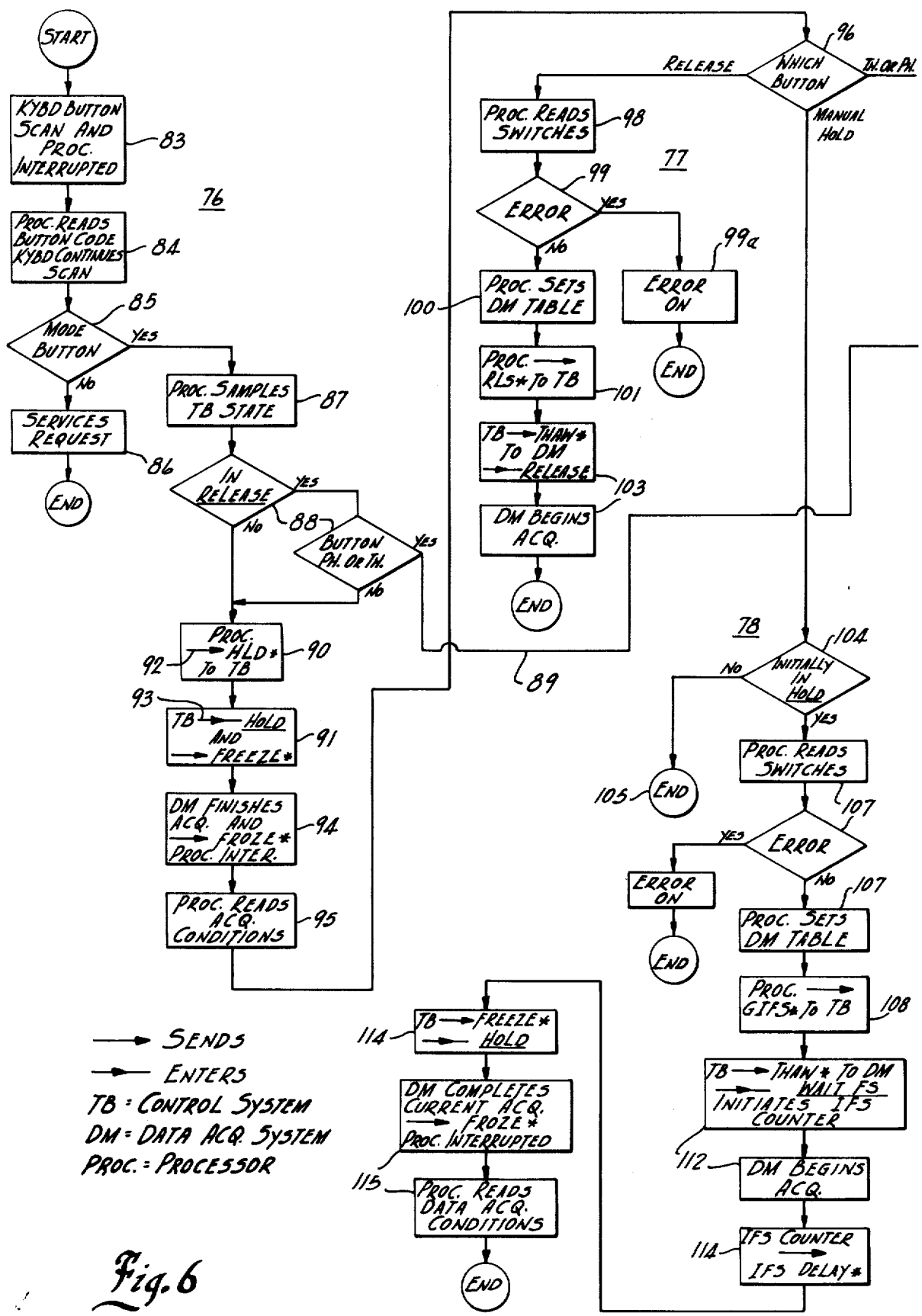
FIGS. 6 and 6a form a block diagram illustrating time sequences in data acquisition and display in the processor controlled instrument of FIGS. 1 - 5.
Figure 6A:
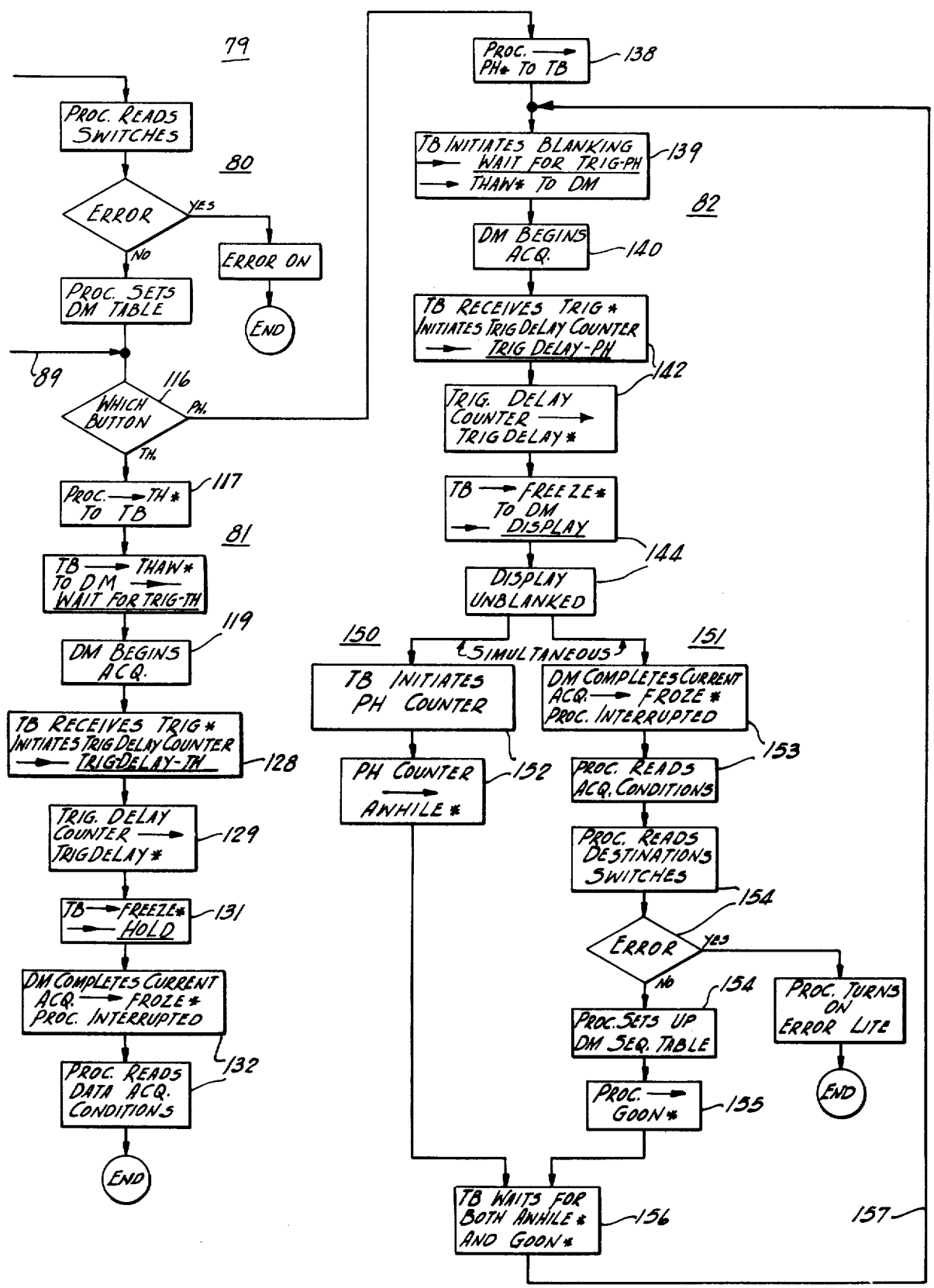

Referring particularly to FIGS. 6 and 6a, a chart of time sequence of the instrument in establishing the modes of data acquisition and display is shown and described with reference to the state diagram of FIG. 4 and routing diagram of FIG. 5 to fully set forth an explanation of the sequences executed in the several data acquisition and display modes and to thereby fully and clearly describe the preferred embodiment of this invention. The state diagram of FIG. 4 is redrawn in FIGS. 7 and 8 to more clearly illustrate the transitions occurring in each of the Triggered Hold mode and the Periodic Hold mode, respectively.

A power up logic means, not shown, may cause the instrument to initialize all systems and enter the Hold state 74 from the Power Up state 75 as shown in FIG. 4. Such instrument condition or state is then maintained until a mode button 61-64 is activated to create a new state. In the Hold state 74, the data acquisition system is inactive and the display system is active. The instrument therefore stores and displays the last acquired waveform samples in the memory 18. The transfer from the Hold state 74 to a data acquisition mode is user controlled by operation of the mode buttons 61-64.

Referring particularly to FIG. 6, a common button processing channel 76 is shown for monitoring the actuation of the several push-button and key elements of the instrument, including the mode control buttons 61-64. The output of this common channel 76 is connected to a Release mode channel 77, a Manual Hold channel 78 and, shown in FIG. 6a, a Triggered and Periodic Hold channel 79 which includes a first common portion 80 connected to an individual Triggered Hold channel 81 and a Periodic Hold channel 82.

The sequence starts when a push-button of the instrument or an external pulse is received by the instrument. Either event results in the generation of a signal, as the keyboard circuit is scanned and a button actuation is detected. A processor interrupt is set as shown at 83. The processor 24 services such interrupt in any desired appropriate manner, for example, as disclosed in the previously identified copending application of Frederick A. Rose. Generally, the processor 24 reads the button code as shown at 84. The keyboard scan continues. The processor 24 first makes a decision as to whether or not the actuated button was one of the mode buttons 61-64, as shown by the decision logic symbol 85. If the button was not a mode button, processor 24 suitably processes the signal in an appropriate program not significant to the present invention and, therefore, shown generally at 86. If the signal was the result of a mode button, the processor 24 continues the program shown and samples the control system as at 87 to determine the existing instrument state for subsequent processing of the button actuation. In particular, the processor first makes a decision as to whether the Release state exists, and, if so, whether the Periodic Hold button or the Triggered Hold button was depressed, as shown diagrammatically at 88. If both conditions exist, the processor steps directly, as shown by a line 89, to the common portion 80 of the combined Periodic Hold and Triggered Hold channel 79 (FIG. 6a). This system is described hereinafter.

If the system is not in the Release state, or one of the other two mode buttons was pressed, the processor 24 continues to process the actuation of the button through the common channel 76.

The processor 24 sends a HLD* signal, as shown at 90 in FIG. 6, to the control system 48 which is routed through the logic routing unit 70 from the input 90a of FIG. 5, to line 72 and transmits a FREEZE* signal to the data acquisition system.

This is shown at 91 in FIG. 6 with the control system going into the Hold state and generating the FREEZE* signal.

For simplicity, the sending of a signal is shown in FIGS. 6 and 6a as arrows 92 with the head at one end, and the entry of the system to a specific state by an arrow 93 with the head centered.

The FREEZE* signal initiates the transition of the data acquisition system 8 to an inactive state. Thus, the data acquisition system continues to process any last or current sample which has been initiated at the time the FREEZE* signal is received and transfers the digitized last sample into memory 18, as shown by block 94. At the end of such sample cycle, the data acquisition system sends a signal referred to as "FROZE*" to the processor 24 and particularly sets an interrupt flag which processor 24 services. The processor 24 completes the sampling cycling by recording the data taking conditions for the previous or last data sample, as at 95.

At the end of the recording cycle, the processor 24 continues to service the mode button actuation depending on which one was actuated, as shown by the decision logic symbol 96, and accordingly steps to the program for one of the three main channels, namely, the Release mode channel 77, the Manual Hold channel 78, or the combined Periodic Hold and Triggered Hold channel 79.

If the release mode button 61 was actuated, the program shown by the release mode channel 77 is executed to place the instrument in the Release state, box 97 in FIG. 4. The Release state is partially defined, as shown in FIG. 4, as including an active data acquisition system 8 and an unblanked display system 25. Thus, to produce the Release state, only the data acquisition system must be changed from the inactive to the active state. The time sequence, as shown in FIG. 6, first causes the processor 24 to condition the data acquisition system 8 for data acquisition by reading the plug-in designation switches with respect to the setting of the memory array destination switch 12 for the several channels as shown at 98. The existence of a conflict is thus checked as shown by logic symbol 99, and if an error exists, an error branch 99a is completed, shown including the processor turning on a lamp and then ending the service of the button actuation. For example, if a pair of signal channels are set to read into the same memory array $Q_1$–$Q_4$, an error signal is generated. The error signal may also be employed to appropriately develop an error message on screen 5. If no error is present, the processor 24 writes the data memory table 27a for proper acquisition of data, as at 100. This step is completed before the taking of each sample such that the proper conditions are created in the data memory unit 17. The processor 24 then sends an RL* to the control system 48 as shown in FIG. 5 and at 101 in FIG. 6. The signal terminal 102 is routed by the logic means 70 to the "THAW*" signal line 71 and results in the "THAW*" signal to the data acquisition system 8 which then enters the active state, and begins to acquire data as shown at 103 in FIG. 6. The processing of the button has ended with the system in the Release state; that is, the data acquisition system 8 continuously samples and inputs data into memory unit 17. The display system 25 is unblanked such that the data is displayed, with the data continuously moving across the display tube 5.

If, at the decision step 96 of FIG. 6, actuation of Manual Hold button 63 had been present, the processor 24 branches to the manual hold branch 78. In this program, the processor further branches based on the decision as to whether the instrument was in the Hold state 74, as shown by the logic symbol 104 in the channel 78, at the time the button 63 was actuated. If the system was not in the Hold state at the time the button 63 was depressed the system has already been put into the Hold state at 91 and so no further processing is necessary. The processor 24 notes the immediate end of the cycle and returns to other tasks. The signal HLD* always returns the system to the HOLD state from any other state, but, for simplicity, the transitions due to HLD* are not shown in FIGS. 4, 7 and 8.

If the instrument was in the Hold state at the time the button 63 was depressed, the processor 24 initiates the New Full Array mode which is a two-state cyclical mode in which the instrument changes to a "Wait-Full Scale" state 106, shown in the state diagram of FIG. 4 and then returns to the Hold state 74. In the Wait-FS state 106, the data acquisition system 8 is active to acquire one full scale of data, the display system 25 remains active and the control system 48 is responsive to the signal IFS DELAY* to produce the return to the Hold state. The New Full Array sequence is described with reference to FIGS. 5 and 6. As shown at 107 in FIG. 6, the processor 24 first reads the destination information and the like, decides as to the presence of any error and appropriately writes the error message or write the appropriate memory table 27a as previously described for the release mode branch 77. After completing this task, and assuming no error, the processor 24, as shown at 108 in FIG. 6, sends a signal identified in FIGS. 4–7 as a GIFS* signal to the control system 48 which is an instruction to place the data acquisition system 8 in the active state. As shown in FIG. 5, the signal appears at line 66 and at the input terminal 109 of the logic routing unit 70. As also shown in FIG. 5, the control system 48 routes the signal to the THAW* line 71 of FIG. 5 to activate the data acquisition system 8 to begin data acquisition. The signal GIFS* is also routed to a counter-start line 110 to start a one full scale counter 111 in FIG. 5 to initiate a timing cycle. The IFS counter 111 is shown in FIG. 5 as a separate timing counter which with other counters forms the time delay means 59 shown in FIG. 3. In practice, a single counter with necessary outputs is employed. The separate counters are shown for purposes of convenience.

The activation of data acquisition means and start of the counter 111 creates the Wait-FS state 106 of FIG. 4. The time sequence is shown at 112 in the sequence diagram of FIG. 6. The sample interval clock 57 provides count signals in precise time relationship to the data sampling. When one new full array of data has been taken, the counter 111 has counted a similar output of the clock and establishes a full scale delay signal (IFS DELAY*) at the output line 113 of counter 111. The signal is applied to the routing logic unit 70 and routed to the output terminal to FREEZE* line 72, as also shown at 114 in FIG. 6. The instrument enters the Hold state with the data acquisition system 8 completing the processing and entry of any sample initiated at or immediately prior to the receiving of the FREEZE* signal as noted at 115 and previously described in the description of steps 93–95. The New Full Array mode has completed the cycle and the processor 24 returns to other normal tasks as defined by the main program memory 46. Thus, each time the Manual Hold button 63 is actuated with the instrument in the Hold state 74, one new full array of data is acquired and stored in memory and also displayed.

If, at the button logic decision step 96, the button actuated was either the Triggered Hold button 62 or the Periodic Hold button 64, the processor 24, in response to the decoding of such button, jumps to the program for the corresponding final channel 79 as shown in FIG. 6a. For either button 62 or 64, the channel 79 includes a series of first program steps forming the common processing portion 80 for both buttons if entered with the instrument in other than the release mode. The processor 24, in particular, reads the control settings of the acquisition system, checks for errors, and sets the error lamp or the data memory table 27a for properly taking data samples, as previously discussed for the other modes of data acquisition.

The processor 24 issues an appropriate identifying signal to the control system 48 in accordance with whether or not the mode button actuated as the Periodic Hold button 64 or the Triggered Hold button 62 as shown by the logic block 116 in channel 80. The sequence for the Triggered Hold mode is first described with reference to FIG. 7 and then the Periodic Hold mode is described with respect to FIG. 8.

The Triggered Hold mode is a cyclical mode, as shown in FIG. 7, and terminates in the Hold mode. Referring to FIGS. 5 and 6a, in response to the operation of the Triggered Hold button, the processor 24 sends TH* to the control system 48, as shown at 117 in FIG. 6a and the connection of the triggered hold line 68 to terminal 118 of FIG. 5. The signal is routed to THAW* signal line 71 and the data acquisition system enters the active state and begins data acquisition as at 119 in FIG. 6a. The signal is also routed to an output connected to the set line 120 of a trigger enable flip-flop 121, the output of which is connected to enable a two input AND gate 122. The trigger signal circuit 56 is connected as the second input to gate 122. This completes a transition in the state of the instrument to the Wait-For-Trig-TH state 123 of FIG. 7, in which data acquisition is active and the display is unblanked. The control system 48 is now sensitive to the trigger signal. When TRIG* is received, it can pass through gate 122 and appears at a time control input terminal 124 of the control system. The trigger signal is routed by the logic unit 70 to an output terminal connected to the reset line 125 of the trigger enable flip-flop 121 and to a trigger delay counter 126 of the delay means 59. When the trigger signal (TRIG*) is received indicating a valid trigger event has occurred, the counter 126 is activated and begins a time cycle. This causes a transition of the instrument to a Trigger Delay-TH state 127. There is no change in the acquisition or display system but the control system is made insensitive to the trigger signal and made sensitive to the TRIG DELAY* signal from counter 126. This is shown at 128 in FIG. 6a. The counter 126 initiates a count cycle which counts in synchronism with the sampling rate such that the precise time of generating an array related size is determined. At a time, specified by the trigger delay switch 58, the counter 126 creates the TRIG DELAY* signal, as shown at 129 in FIG. 6a. This signal appears, as shown in FIG. 5, at an input 130 of logic unit 70 which routes the signal to the FREEZE* signal line 72. This causes the instrument to return to the Hold state 74. This is shown at 131 in the time sequence of 6a. The data acquisition system 8 completes the acquisition of any last data sample, as shown at 132 in FIG. 6a.

The Triggered Hold program sequence has been completed with the instrument in the Hold state, where the instrument remains until some other mode is requested by user operation of one of the mode buttons 61-64.

Actuation of the Triggered Hold mode button 62 with the instrument in the release state 97 results in a similar system state sequence. However, as shown in FIGS. 6a and 7, the transition first to the Hold state 74, shown in FIG. 6 at 91, is by-passed by the control system 48, as shown by line 89, and the Wait-For-Trig-TH state 123 of FIGS. 4 and 7 is entered directly.

Now assuming the Periodic Hold button 64 had been depressed rather than the Triggered Hold button 62, as assumed for the above description, the instrument enters a continuous, cyclical operating mode, as shown in FIG. 8, which does not terminate until another button 61-63 is pushed by the operator. Referring particularly to FIG. 5, the appropriate Periodic Hold signal (PH*) is formed at line 69 which is connected to one input of a two input OR gate 133, the output of which is connected to an input 134 of the routing logic unit 70. The signal is routed to the output to THAW* signal line 71 and to the output to the set input 120 of the trigger enable flip-flop 121. This routing is similar to that for the Triggered Hold signal (TH*). In addition, the periodic hold input 134 is routed to an output connected to the set input 135 of a Blank flip-flop 136, the output of which is the BLANK* signal line 73. The signal PH*, therefore, causes a transition to the Wait-For-Trig-PH state 137 in FIG. 8. In this state, the data acquisition 8 is active and the control system is sensitive to the signal TRIG*, as in the Wait-For-Trig-TH state 123. However, the display system 25 is blanked in this state 137. This time sequence is shown in FIG. 6a in channel 82 with the processor 24 sending the signal shown at 138 and the resulting transition shown at 139. The data acquisition begins as shown at 140.

The data acquisition system begins to acquire data and the control system, and particularly the gate 122 of FIG. 5, waits for the trigger signal. The trigger source is again set by the user through the selection switches on the panel section 15 and coupled to the time base unit 48 through the trigger circuit 56. A valid trigger signal TRIG* activates the Trigger Delay counter 126 and causes transistion of the instrument to a TRIG-DELAY-PH state 141. There is no change in the data acquisition system or the display system, but now the control system 48 is insensitive to any further trigger signal TRIG* and is sensitive to the trigger delay signal TRIG DELAY* from the counter 126. The signal TRIG DELAY* occurs after the signal TRIG* by the time specified by the setting of trigger delay switch means 58.

As shown in FIG. 6a, the time sequence shown at 142 in the Periodic Hold channel 82 is similar to the trigger related states shown at 128 and 129 of the Triggered Hold channel 81. In the Periodic Hold mode the trigger delay signal TRIG DELAY* causes a transition in the instrument from the Trig-Delay-PH state 141 to a Display state 143 for the display unit 1, as shown at 144 in FIG. 6a. As shown in FIG. 8, in the display state 143, the data acquisition system 8 is inactive and the display system 25 active or unblanked and appropriately operatively coupled to memory unit 17 for display of the data in memory 18.

The control system 48 is, in the Display state 143, made sensitive to a pair of signals, one of which is a display timing signal, identified herein as an AWHILE* signal, and the second of which is processor task completed signal, identified herein as a GOON* signal.

The signal routing to create the Display state 143 is shown in FIG. 5 in which the TRIG DELAY* signal line from counter 126 is returned to the input terminal 130 and routed to the FREEZE* signal line 72. In addition, the signal is connected as one input to a two input AND gate 146. The second input to gate 146 is derived from a Periodic Hold flip-flip unit 147 which is set to enable gate 146 only when in the Periodic Hold mode. The flip-flop unit 147 has its set input connected to the PH* line 69 and the reset input connected to the TH* line 68. The TH* signal thus resets the flip-flop unit 147 and disables the gate 146 whenever the Triggered Hold button 63 is actuated. The PH* signal sets the flip-flop unit 147 and enables gate 146 for routing of the TRIG DELAY* signal through gate 146 to input terminal 148 of routing logic unit 70. This signal is routed to an output connected to reset line 148a of the Blank flip-flop 136 and thereby remove the BLANK* signal from line 73 and bring back the display of the waveform data. This signal is also routed to an output connected to activate a PH Display counter 149, which is part of means 59 and also driven from the sample clock means. Counter 149 is a timer which times the amount of time during which the data now stored in memory 18 is to be displayed, and thus is the source of the AWHILE* signal. The time sequence of the instrument in the Display state 143 is shown in FIG. 6a including the simultaneously created time sequence channels 150 and 151 for forming both signals, AWHILE* and GOON*.

Channel 150 includes activating the PH counter 149 which initiates a count related to the sampling rate. In a preferred embodiment of the invention, this count time is made equal to the time required for one full array of data acquisition, although no data is being acquired at the time. The counter 149 thus counts to the selected setting and generates the AWHILE* signal as shown at 152.

Simultaneously, the processor 24 is completing the various housekeeping tasks required including those demanded by the FREEZE* signal previously generated at timing position 144. Thus, the data acquisition system 8 completes the last sample and the processor reads the acquisition condition as shown at 153. The processor 24 then reads and creates the proper settings for conditioning the data acquisition system 8 to again being made active, as shown at 154. When all proper conditions exist, the processor generates the GOON* signal, as at 155.

A means similar to a latching AND gate 156 receives the signals AWHILE* and GOON*, the end results of the dual channels 150 and 151 to determine when both channels have completed their sequences. The receipt of both these signals causes a transition back to the Wait-For-Trig-PH state 137 to initiate a new cycle identical to that just described, as shown in FIG. 4 and also shown in FIG. 6a by the recycle line 157.

The signal routing for the signals AWHILE* and GOON*, is shown in FIG. 5. The PH Display Counter 149 has its output connected to one input of the latching AND gate. The GOON* output of processor 24 is connected to the second input of gate 156 to develop an output when both signals have been received. The output of gate 156 is connected to the second input of the OR gate 133 and the recycle signal is thus passed to input terminal 134 to initiate a Periodic Hold cycle in the same manner as created by the initial signal PH* from the processor 24 via line 69. The Periodic Hold channel 82 of FIG. 6a thus initiates a new cycle in the Wait-For-Trigger-TH state 137 in which the display system is blanked, the data acquisition system is active and the control system 48 again waits for the prescribed trigger signal, responds to such signal to generate a time delay and continues through the Periodic Hold channel in the same sequence as just described, to first capture new waveform data in memory unit and only then again unblanking the display system, to present the waveform frame now in memory unit. During the blanking of the display system, the previous display of memory remains as a result of the character of the conventional screen 5 and thus an apparent continuous presentation of the waveform is made. The actual presentation of series of static waveforms, however, permits seeing changes which occur in the waveform.

Where a rapidly varying waveform signal is being studied, the Periodic Hold mode of data acquisition and display particularly permits visually following the changes in such waveform. Thus, the rapid sample rate required to capture the changes may, in the Release state, generate a display moving so rapidly that the eye cannot discern detail in the individual periods of the waveform. The display then is a generally meaningless blur. The unique capture and presentation of a series of closely-spaced captured waveform portions, each of which is displayed as a separate static frame for a short time, presents an apparent moving waveform, with the variations from one period to the next readily discernible by the human eye.

Referring to FIG. 8, the Periodic Hold mode of data acquisition and display may be established from either the Hold state 65 or the Release state 66. The time sequence, as shown in FIGS. 6 and 6a, is similar to that for the Trigger Hold mode wherein the sequence may jump directly from the Release mode, at stop 88 of FIG. 6, to either the Triggered Hold channel 81 or the Periodic Hold channel 82.

In summary, in the unique Periodic Hold mode, the control system creates a unique repetitive data acquisition and display mode sequence in which the data acquisition system and the display system are automatically alternated between active and inactive states to develop a series of static waveform displays. In particular, when the Periodic Hold button is depressed, the control system establishes a sequence, as shown in FIG. 8, in which the instrument state cycles from the Wait-For-Trig.-PH state 137 during which the data acquisition system stores waveform samples in memory and the display system is blanked. A delayed trigger signal, which is defined in the same manner as in the Triggered Hold mode creates the Trig. Delay-PH state 141, during which waveform data is still acquired and the display is blanked. The signal Trig Delay* then creates the Display state 143 in which the data acquisition system is made inactive and the display system is unblanked. The waveform samples in memory are then and only then displayed for a period of time which is at least equal to the time necessary to fill the specified memory with one full array. After the end of the display period, the data acquisition system is again activated to state 137 to respond to a subsequent delayed trigger signal. During the period the data display system is blanked, the previous display is retained for viewing as a result of the inherent memory in the display screen. The cyclical loop continues until such time as a different mode of operation is selected.

The Periodic Hold mode thus provides a highly unique method of implementing a digital display to present the waveform in a manner which will clearly provide a fisual representation of the changes occurring in the waveform. It thus permits the application of the digital display device to monitor rapidly assembled waveforms in much the same manner as employed in the conventional oscilloscope. The other modes of course permit more conventional type of displays including capturing waveform information as a status display or continuously displaying of a live waveform.

Various modes of carrying out the invention are contemplated as being within the scope of the following claims, particularly pointing out and distinctly claiming the subject matter which is regarded as the invention.

I claim:

1. In a waveform display apparatus having a digital memory means including a plurality of memory cells each capable of storing digitized data values, data acquisition and digitization means for sampling an input waveform and generating a sequence of digitized waveform data values and connected to said digital memory means for forming a stored representation of said waveform, trigger means having an input responsive to a predefined physical event for establishing a triggering signal and for controlling transmittal of said data values to the memory means, display means connected to said memory means and adapted to present said waveform data values stored in said memory means as a visual representation of said waveform, and control means connected to said digitization means and said display means and said trigger means and operable for selectively establishing and preventing the transmittal of said waveform data values to said memory means for storage and also operable for selectively establishing and preventing the display of said stored waveform data values by said display means, the improvement in said control means for establishing a periodic hold mode of operation wherein the apparatus alternates between a first operating state in which said digitization means continuously transmits waveform data values which are stored in said memory means and a second operating state in which said waveform data value transmittal is prevented and said waveform data values stored in said memory means are visually displayed by said display means, said control means having first means connected to said trigger means and establishing transition from said first state to said second state at a time related to said triggering signal for presenting the waveform stored in said memory means and having second means automatically establishing a transition from the second state to the first state a predetermined time after establishing of the second state for again transmitting data values to said memory means until said time related to said trigger signal, said last named data values replacing data values stored in memory cells of a previously displayed portion of the waveform, and said control means having an input means for activating said first and second means and thereby operating the apparatus to display a rapid succession of individual visual representations of time-spaced portions of said input waveform, each of said portions being related in the same predetermined way in time to the time of each of a succession of said physical events.

2. The apparatus of claim 1 wherein the digitization means has means for selecting a fixed sample time for sampling of the waveform and digitization of each sample, and said second means being constructed whereby said predetermined time is related to the digitization rate of the digitization means.

3. In the display apparatus of claim 1 wherein said control means includes a release sequence means controlling said coupling of said data acquisition means and said display means to said memory means for establishing a release operating sequence in which the acquisition means continuously acquires data and said display means displays the data as a moving waveform, a second input means for activating said release sequence means, a programmed processor including an input sequence program means having a common program portion to process operation of said input means and subsequent actuation of said apparatus and including means to record creation of the release sequence means, said program means being responsive to the record of the release sequence and said subsequent actuation to directly establish said periodic hold sequence in response to actuation of the first input means.

4. In the display apparatus of claim 1 wherein said apparatus includes a sample timing means connected to the data acquisition means and controlling the rate of sampling said waveform signal, a time base means having a time delay means operating in synchronism with said sample timing means and operable with said trigger means to establish control signals to said first and second means, said first input means activating the time delay means to establish said repetitive sequence.

5. In the display apparatus of claim 4 wherein said apparatus includes a hold sequence in which the data acquisition means is inactive and the display means is active, a release sequence in which the data acquisition means and the display means are active, and a second trigger signal responsive sequence in which the data acquisition means is active and the display means is unblanked, said input means establishing input signals for selection of said additional sequences.

6. In the display apparatus of claim 4 wherein said control means is responsive to timing signals, and including said programmed processor having a program memory means for establishing periodic hold sequence time signals, and user controlled means to actuate said processor to correspondingly signal said logic means from said program memory means.

7. In the display apparatus of claim 4 wherein said apparatus includes a hold sequence in which the data acquisition means is inactive and the display means is active, a release sequence in which the data acquisition means and the display means are active, a trigger signal responsive sequence in which the data acquisition means is active and the display means is unblanked, a second trigger signal responsive sequence in which the data acquisition means is active and the display means is blanked, a display sequence in which the data acquisition is inactive and the display means is unblanked, said apparatus further including said periodic hold sequence input means connected to actuate the time delay means to establish a repetitive sequence between said second trigger signal responsive sequence and said display sequence, said logic control means being operable to activate said apparatus to establish said hold sequence and said release sequence and to activate the time delay means to establish a single cycle of the first signal responsive sequence and said hold sequence, a programmed processor having a program memory means for actuating said logic means for each of said sequences, and user controlled means connected to the processor to actuate the processor to correspondingly signal said logic means.

* * * * *